United States Patent
Guo et al.

(10) Patent No.: US 10,481,715 B2
(45) Date of Patent: Nov. 19, 2019

(54) TOUCH ASSEMBLY, DISPLAY PANEL AND A METHOD FOR MANUFACTURING TOUCH ASSEMBLY

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Yuanhui Guo, Beijing (CN); Yunbok Lee, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 133 days.

(21) Appl. No.: 15/742,882

(22) PCT Filed: Feb. 24, 2017

(86) PCT No.: PCT/CN2017/074764
§ 371 (c)(1),
(2) Date: Jan. 8, 2018

(87) PCT Pub. No.: WO2018/086274
PCT Pub. Date: May 17, 2018

(65) Prior Publication Data
US 2018/0210588 A1 Jul. 26, 2018

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G02F 1/133514* (2013.01);
(Continued)

(58) Field of Classification Search
CPC .................. G06F 3/0412; G06F 3/041; G06F 2203/04103; G02F 1/133514; G02F 1/13338; G02F 2201/123; H01L 27/323
See application file for complete search history.

(56) References Cited

U.S. PATENT DOCUMENTS

| 2010/0225611 A1 | 9/2010 | Lee et al. |
| 2017/0123559 A1 | 5/2017 | Yang et al. |

(Continued)

FOREIGN PATENT DOCUMENTS

| CN | 101424817 A | 5/2009 |
| CN | 101526682 A | 9/2009 |

(Continued)

OTHER PUBLICATIONS

International Search Report and Written Opinion, for PCT Patent Application No. PCT/CN2017/074764, dated Aug. 3, 2017, 16 pages.

(Continued)

*Primary Examiner* — Premal R Patel
(74) *Attorney, Agent, or Firm* — Kinney & Lange, P.A.

(57) ABSTRACT

A touch assembly, a display panel containing the touch assembly, and method for manufacturing the touch assembly are provided in embodiments of the disclosure. The touch assembly includes: a substrate; and a plurality of touch electrodes. Each of the plurality of touch electrodes includes a first touch electrode portion and a plurality of second touch electrode portions provided on the first touch electrode portion, and the first touch electrode portions of all of the plurality of touch electrodes are provided alternately in a (Continued)

first period on the substrate and distributed to space apart from one another, and the second touch electrode portions are provided alternately in a second period on each of the first touch electrode portions and distributed to space apart from one another, the second period being smaller than the first period.

16 Claims, 4 Drawing Sheets

(51) Int. Cl.
    *G02F 1/1335*     (2006.01)
    *H01L 27/32*     (2006.01)

(52) U.S. Cl.
    CPC ........ *G06F 3/041* (2013.01); *G02F 2201/123* (2013.01); *G06F 2203/04103* (2013.01); *H01L 27/323* (2013.01)

(56) References Cited

U.S. PATENT DOCUMENTS

| | | | |
|---|---|---|---|
| 2017/0193275 A1* | 7/2017 | Liu | G06K 9/0002 |
| 2017/0255303 A1* | 9/2017 | Huang | G06F 3/047 |

FOREIGN PATENT DOCUMENTS

| | | |
|---|---|---|
| CN | 103309536 A | 9/2013 |
| CN | 104199575 A | 12/2014 |
| CN | 204515258 U | 7/2015 |
| CN | 104866130 A | 8/2015 |
| CN | 105404418 A | 3/2016 |

OTHER PUBLICATIONS

First Chinese Office Action received Dec. 26, 2018 for corresponding Chinese Application No. 201611005528.3.

\* cited by examiner

TOUCH ASSEMBLY, DISPLAY PANEL AND A METHOD FOR MANUFACTURING TOUCH ASSEMBLY

CROSS-REFERENCE TO RELATED APPLICATIONS

The present application is the national phase of PCT Application No. PCT/CN2017/074764, which in turn claims the benefit of Chinese Patent Application Invention No. 201611005528.3 filed on Nov. 11, 2016 in the State Intellectual Property Office of China, the whole disclosure of which is incorporated herein by reference.

BACKGROUND

Technical Field

Embodiments of the present disclosure relate to the technical field of display, and in particular, to a touch assembly, a display panel and a method for manufacturing a touch panel.

Description of the Related Art

In the technical field of display, a touch display panel having touch function has seen increasingly extensive use due to convenience thereof in operation. Typically, specific structures of the touch display panel comprise three types: an Out-Cell Touch Panel having a touch assembly (e.g., a touch screen) which is provided independently of a display panel; an In-Cell Touch Panel having a touch assembly which is provided within a display panel; and an On-Cell Touch Panel having a touch assembly which is provided on a surface of a display panel.

Nowadays, the On-Cell Touch Panel has become a predominant touch solution due to its advantages such as relatively low cost, relatively thin finished product and relatively small effect on light rays. However, in contrast to other touch solutions, as far as a product of the type of On-Cell Touch Panel is concerned, there exist differences in luminance across the product, resulting in a phenomenon of bright and dark stripes, since a light transmittance of an inclined side region of touch electrodes therein at a taper angle thereof is lower than that of a flat surface region of the touch electrodes. In addition thereto, since a period of arrangement of the touch electrodes of glass surface (e.g., manufactured by ITO) is similar to that of pixel electrodes, such that gratings formed by bright and dark stripes in a layer of the touch electrodes (with the dark stripes being formed at the taper angle while the bright stripes being formed at other portions) have a frequency similar to that of gratings formed by bright and dark stripes in a layer of the pixel electrodes (with the bright stripes being formed at the pixel electrodes while the dark stripes being formed at black matrices), resulting in a coherence phenomenon and in turn Moiré fringes.

SUMMARY

According to a first aspect of the exemplary embodiment of the present disclosure, there is provided a touch assembly, comprising: a substrate; and a plurality of touch electrodes. Each of the plurality of touch electrodes comprises a first touch electrode portion and a plurality of second touch electrode portions provided on the first touch electrode portion, and the first touch electrode portions of all of the plurality of touch electrodes are provided alternately in a first period on the substrate and distributed to space apart from one another, and the second touch electrode portions are provided alternately in a second period on each of the first touch electrode portions and distributed to space apart from one another, the second period being smaller than the first period.

According to an embodiment of the disclosure, the first period of the first touch electrode portions is 2-10 times of the second period of the second touch electrode portions.

According to an embodiment of the disclosure, each of the first touch electrode portions and the second touch electrode portions has a trapezoidal cross section, inclined sides of the trapezoidal cross section of each first touch electrode portion being staggered with inclined sides of the trapezoidal cross section of each second touch electrode portion.

According to an embodiment of the disclosure, a width of a horizontal projection of each of the inclined sides of the trapezoidal cross section of each first touch electrode portion on the substrate is approximately equal to a width of a horizontal projection of each of the inclined sides of the trapezoidal cross section of each second touch electrode portion on the substrate.

According to an embodiment of the disclosure, the first touch electrode portions and the second touch electrode portions are arranged such that horizontal projections of both the inclined sides of all of the trapezoidal cross sections of the first touch electrode portions and the inclined sides of all of the trapezoidal cross sections of the second touch electrode portions on the substrate are arranged collectively to be in a uniform distribution on a plane in parallel with the substrate.

According to an embodiment of the disclosure, a thickness of each of the first touch electrode portions and the second touch electrode portions is a multiple of a half wavelength of light passing through each of the first touch electrode portions or the second touch electrode portions.

According to an embodiment of the disclosure, each first touch electrode portion and the second touch electrode portions provided thereon are formed collectively into an integral structure.

According to another aspect of the exemplary embodiment of the present disclosure, there is provided a display panel, comprising display panel, comprising the touch assembly according to embodiments of the first aspect of the disclosure.

According to an embodiment of the disclosure, a period of pixel electrodes within a display panel is 1-3 times of the first period of the first touch electrode portions.

According to an embodiment of the disclosure, the display panel further comprises an OLED panel, the touch assembly being formed on the OLED panel.

According to yet another aspect of the exemplary embodiment of the present disclosure, there is provided a method for manufacturing a touch assembly, comprising steps of: providing a substrate; and forming a plurality of touch electrodes on the substrate, such that each of the plurality of touch electrodes comprises a first touch electrode portion and a plurality of second touch electrode portions provided on the first touch electrode portion. The first touch electrode portions of all of the plurality of touch electrodes are provided alternately in a first period on the substrate and distributed to space apart from one another, and the second touch electrode portions are provided alternately in a second period on each of the first touch electrode portions and distributed to space apart from one another, the second period being smaller than the first period.

According to an embodiment of the disclosure, forming a plurality of touch electrodes on the substrate comprises: forming on the substrate a first touch electrode layer which comprises the first touch electrode portions; and forming on the first touch electrode layer a second touch electrode layer which comprises all of the plurality of second touch electrode portions provided on all of the first touch electrode portions.

According to an embodiment of the disclosure, the first touch electrode layer is patterned in a first lithography process by a first mask, so as to form the first touch electrode portions; and the second touch electrode layer is patterned in a second lithography process by a second mask, so as to form the all of the plurality of second touch electrode portions provided on all of the first touch electrode portions.

According to an embodiment of the disclosure, forming a plurality of touch electrodes on the substrate comprises: forming an electrode layer of a uniform thickness on the substrate; and patterning the electrode layer such that the electrode layer is formed into the first touch electrode portions and all of the plurality of second touch electrode portions provided on all of the first touch electrode portions.

According to an embodiment of the disclosure, the step of patterning the electrode layer comprises: patterning the electrode layer in a single one lithography process by a half-tone mask.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of the transportation support assembly and the transport device.

The directional terminologies mentioned in the embodiments, such as "above", "below", "front", "back", "left", "right", and the like, only refer to directions by referring to the drawings, rather than apply any limitation on scope of protection of the disclosure. Furthermore, above embodiments may be implemented based on a consideration of design and reliability, and cooperate with one another or with other embodiment(s), in application; in other words, technical features in different embodiments may be combined freely so as to construct more embodiments.

Figure 1A:
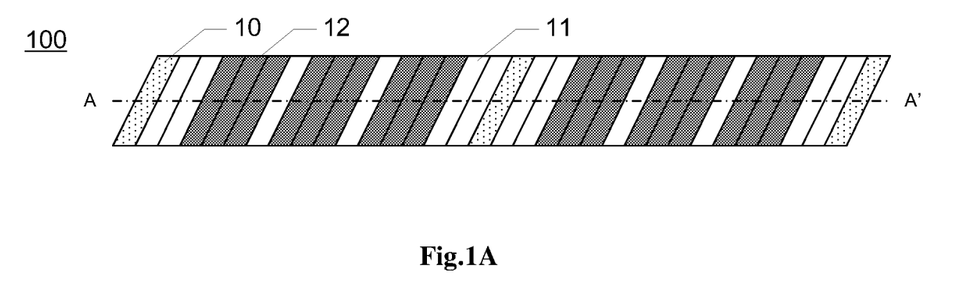
FIG. 1A illustrates a schematic top view of a touch assembly according to an embodiment of the disclosure.
Figure 1B:
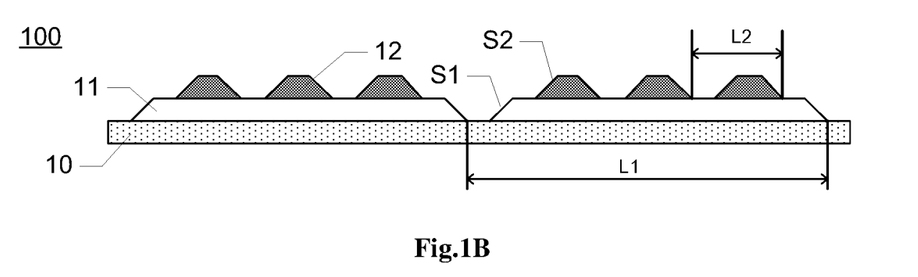
FIG. 1B illustrates a schematic sectional view of the touch assembly as illustrated in FIG. 1A, along a line A-A' therein.

FIG. 1A illustrates a schematic top view of a touch assembly according to an embodiment of the disclosure; and FIG. 1B illustrates a schematic sectional view of the touch assembly as illustrated in FIG. 1A, along a line A-A' therein. As illustrated in FIGS. 1A and 1B, according to a general technical concept of the present disclosure, there is provided a touch assembly 100, comprising: a substrate 10 and a plurality of touch electrodes provided on the substrate 10, each of the plurality of touch electrodes comprising a first touch electrode portion 11 and a plurality of second touch electrode portions 12 provided on the first touch electrode portion 11. The first touch electrode portions 11 of all of the plurality of touch electrodes are provided alternately in a first period L1 on the substrate 10 and distributed to space apart from one another, and the second touch electrode portions 12 are provided alternately in a second period L2 on each of the first touch electrode portions 11 and distributed to space apart from one another, the second period L2 being smaller than the first period L1. By way of example, the first period L1 of the first touch electrode portions 11 is for example about 50 µm while the second period L2 of the second touch electrode portions 12 is for example about 10 µm. The substrate 10 is for example a glass substrate. And the first touch electrode portions 11 and the second touch electrode portions 12 are for example formed by a transparent ITO material.

The first period as set forth herein refers to an overall length of a period of arrangement of first touch electrode portions 11 which are arranged regularly, and the second period as set forth herein refers to an overall length of a period of arrangement of second touch electrode portions 12 which are also arranged regularly, respectively. Correspondingly, in an embodiment of the disclosure, by way of example, a frequency of distribution of the touch electrodes (or touch electrode portions) may be defined as a specific number of the touch electrodes (or touch electrode portions) which are distributed on a certain length of the display panel, and a frequency of distribution of pixel electrodes may be defined as a specific number of the pixels electrodes which are distributed on a certain length of the display panel, a period of the pixel electrodes being defined to be an overall length of a period of arrangement of the pixel electrodes which are arranged regularly, for example.

In the touch assembly 100 as illustrated in FIG. 1A and FIG. 1B, one of the first touch electrode portions 11 provided on the substrate, and the plurality of second touch electrode portions 12 provided on the one of the first touch electrode portions 11, are used collectively to substitute one of touch electrodes in a conventional touch assembly, and the first period of the first touch electrode portions 11 is for example set to be substantially equal to a period of the touch electrodes in the conventional touch assembly, and the second period of the second touch electrode portions 12 is for example set to be less than the period of the touch electrodes in the conventional touch assembly. By such a structure of touch electrodes, as compared with the conventional touch assembly, the frequency of the second touch electrode portions is much larger than that of the pixel electrodes in the display panel, so as to result in an improvement in mitigation of the phenomenon of the Moiré fringes which phenomenon is caused due to a fact that the frequency of the pixel electrodes is similar to that of the touch electrodes in a conventional touch display panel. Meanwhile, since the plurality of second touch electrode portions are provided, and the frequency of the second touch electrode portions is larger than that of the first touch electrode portions, then a frequency of bright and dark stripes appearing in a touch electrode layer of the display panel may be increased, such that the bright and dark stripes in the touch electrode layer may not be perceived and distinguished readily by human eyes, and any visual discomfort caused by an alternate change of the bright and dark stripes may in turn by improved.

Specifically, according to an embodiment of the disclosure, the first period of the first touch electrode portions 11 is 2-10 times of the second period of the second touch electrode portions 12. In other words, the frequency of the second touch electrode portions 12 is 2-10 times of the frequency of the first touch electrode portions 11. As such, it may be ensured that there is a relatively large difference between the second period of the second touch electrode portions 12 and the period of the pixel electrodes, so as to mitigate/alleviate the phenomenon of Moiré fringes caused by a frequency of the touch electrodes being similar to that of the pixel electrodes. For example, as illustrated in FIG. 1B, three second touch electrode portions 12 are provided on each of the first touch electrode portions 11, and the first period of the first touch electrode portions 11 is approximately 3 times of the second period of the second touch electrode portions 12, i.e., the frequency of the second touch electrode portions 12 is approximately 3 times of that of the first touch electrode portions 11.

As illustrated in FIG. 1B, each of the first touch electrode portions 11 and the second touch electrode portions 12 has a trapezoidal cross section, inclined sides S1 of the trapezoidal cross section of each first touch electrode portion 11 being staggered with inclined sides S2 of the trapezoidal cross section of each second touch electrode portion 12. As such, dark stripes formed by the inclined sides S1 of the first touch electrode portions 11 and dark stripes formed by the inclined sides S2 of the second touch electrode portions 12 may be prevented from being connected with each other and joining together by abutting against each other tightly at the borders of these inclined sides S1 and S2, and thus any dark stripe(s) which are formed thereby by being merged to be even larger may also be avoided.

Figure 1C:
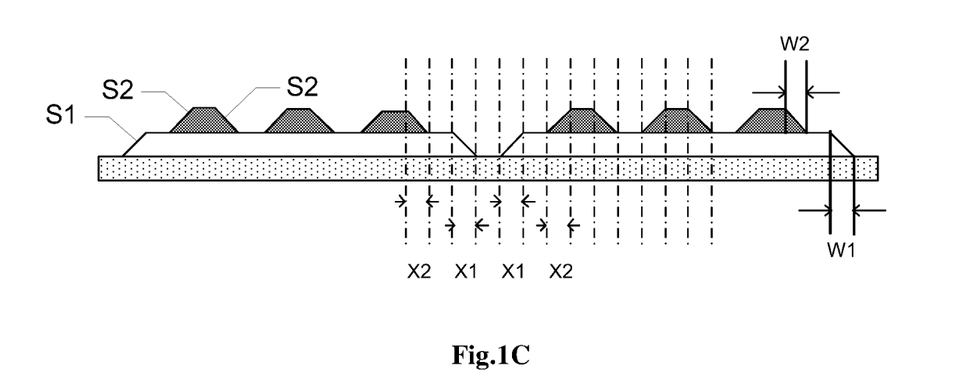
FIG. 1C illustrates a schematic view of dimensional relationships in a section of the touch assembly as illustrated in FIG. 1B.

FIG. 1C illustrates a schematic view of dimensional relationships in a section of the touch assembly as illustrated in FIG. 1B. As illustrated in FIG. 1C, a width W1 of a horizontal projection of each of the inclined sides S1 of the trapezoidal cross section of each first touch electrode portion 11 on the substrate 10 is approximately equal to a width W2 of a horizontal projection of each of the inclined sides S2 of the trapezoidal cross section of each second touch electrode portion on the substrate 10, for example, both W1 and W2 are 0.1 µm.

As such, the width W1 of each dark stripe formed by each of the inclined sides S1 of each first touch electrode portion 11 is substantially equal to the width W2 of each dark stripe formed by each of the inclined sides S2 of each second touch electrode portion 12, such that the dark stripes seem to be distributed in a relatively uniform manner.

Furthermore, the first touch electrode portions 11 and the second touch electrode portions 12 are arranged such that horizontal projections X1 of both the inclined sides S1 of all of the trapezoidal cross sections of the first touch electrode portions 11 and horizontal projections X2 of the inclined sides S2 of all of the trapezoidal cross sections of the second touch electrode portions 12 on the substrate 10 are arranged collectively to be in a uniform distribution. For example, each of X1 and X2 has a width of 0.1 µm. And there is a uniform spacing of 5 µm existing between adjacent X1 and X2, between adjacent X1 and X1, or between adjacent X2 and X2, respectively. As such, the dark stripes may be distributed uniformly across the display panel, and any existence of different dark stripes as formed by the first touch electrode portions and the second touch electrode portions respectively may not be perceived readily by human eyes visually.

According to an embodiment, a thickness of each of the first touch electrode portions 11 and the second touch electrode portions 12 is a multiple of a half wavelength of light passing through each of the first touch electrode portions 11 or the second touch electrode portions 12. As such, film thicknesses of both the first touch electrode portions 11 and the second touch electrode portions 12 meet conditions/requirements for an optical destructive (or eliminative) interference, such that not only a light transmittance but also a luminance of the display panel may be increased. For example, as to a common visible light, there is a highest transmittance for the visible light once there is a highest transmittance for a green-yellow light. Therefore, in design of thicknesses of the first touch electrode portions 11 and the second touch electrode portions 12, the wavelength of the green-yellow light is mainly taken into account.

According to an embodiment of the disclosure, each first touch electrode portion 11 and the second touch electrode portions 12 provided thereon are formed collectively into an integral structure, facilitating manufacturing the first touch electrode portion(s) 11 and the second touch electrode portions 12 from a same kind of material by a single half-tone mask, so as to simplify the manufacturing processes. Certainly, the disclosure is not limited thereto, and the first touch electrode portions 11 and the second touch electrode portions 12 are for example formed into a laminated/layered structure by different materials.

Structures of the touch assembly in several specific embodiments of the disclosure are set forth as above; however, the structures of the touch assembly may not be limited to aforementioned structures. In other embodiments, by way of example, the thickness of the first touch electrode portions 11 may be similar to, or different from that of the second touch electrode portions 12; and the taper angle of the trapezoidal cross section of the first touch electrode portions 11 may be similar to, or different from that of the trapezoidal cross section of the second touch electrode portions 12. Besides, both the first touch electrode portions 11 and the second touch electrode portions 12 may be provided with a cross section in a form of an isosceles trapezoid shape or a non-isosceles trapezoid shape, for example. Only if each of the first touch electrode portions 11 is provided thereon with a plurality of second touch electrode portions 12, so as to increase the frequency of the touch electrodes and to achieve an effect of embodiments of the disclosure, i.e., decreasing both the Moiré fringes and the bright and dark stripes.

Figure 2:
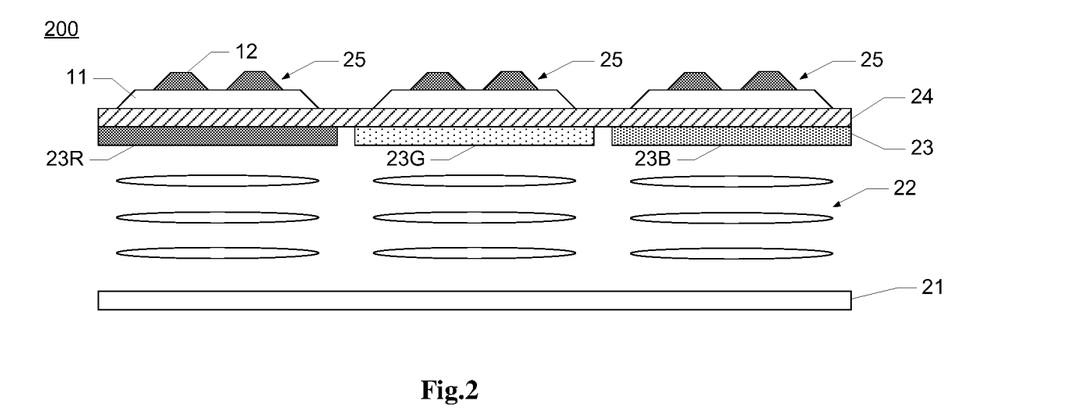
FIG. 2 illustrates a schematic sectional view of a display panel according to an embodiment of the disclosure.

The touch assembly 100 in above embodiments of the disclosure is for example used in a touch product of a SLOC type (in which all of the touch electrodes are on a surface of the display panel) or a HIC type (in which a portion of the touch electrodes are on a surface of the display panel). FIG. 2 illustrates a touch product in which all of the touch electrodes are provided on a surface of the display panel. As illustrated in FIG. 2, the display panel 200 comprises a TFT array substrate 21, a liquid crystal layer 22, a color filter layer 23 and a glass substrate 24, all of which are disposed to be stacked sequentially on one another, from the bottom up. A plurality of touch electrodes 25 are formed on the glass substrate 24. In such an example, an assembly formed by the glass substrate 24 and the touch electrodes 25 are provided collectively corresponding to the touch assembly 100 as illustrated in FIGS. 1A and 1B. In other words, the glass substrate 24 is provided corresponding to the substrate 10 as illustrated in FIG. 1B, and each of the touch electrodes 25 comprises a first touch electrode portion 11 and a plurality of second touch electrode portions 12 provided on each first touch electrode portion 11. And a plurality of the first touch electrode portions 11 are provided alternately in a first period on the glass substrate 24 and distributed to space apart from one another, and a plurality of the second touch electrode portions 12 are provided alternately in a second period on each of the first touch electrode portions 11 and distributed to space apart from one another, the second period being smaller than the first period. As used herein, the touch electrodes 25 may for example be touch driving electrodes or touch sensing electrodes.

In the display device 200 as illustrated in FIG. 2, the color filter layer 23 may for example comprises a red filter layer 23R, a green filter layer 23G and a blue filter layer 24B which are arranged in an array, each of the red filter layer 23R, the green filter layer 23G and the blue filter layer 24B is provided corresponding to one pixel electrode. FIG. 2 illustrates a condition that one pixel electrode is provided corresponding to one touch electrode 25. As illustrated in FIG. 2, by way of example, each touch electrode 25 comprises one of the first touch electrode portions 11 and two of the second touch electrode portions 12 provided on the former.

As an alternative example, according to other exemplary embodiments of the disclosure, a period of the pixel electrodes in the display panel 200 is for example 1-3 times of the first period of the distribution of the first touch electrode portions, and the first period of the distribution of the first touch electrode portions 11 is for example 2-10 times of the second period of the distribution of the second touch electrode portions 12. In other words, each of the pixel electrodes is provided thereon with 1-3 of the first touch electrode portions 11, and each of the first touch electrode portions 11 is provided thereon with 2-10 of the second touch electrode portions 12.

In contrast to a condition in which a conventional touch display panel comprises touch electrodes which are arranged in only one electrode layer, in the embodiment of the disclosure, each touch electrode is configured to comprise two layers, i.e., one layer of the first touch electrode portion(s) and the other layer of the second touch electrode portion(s), with the first period of the first touch electrode portions being configured to be corresponding to the period of the touch electrodes in the conventional display panel and the second period of the second touch electrode portions being configured to be smaller than the first period of the first touch electrode portions, such that there is a relatively large difference between the frequency of the second touch electrode portions and that of the pixel electrodes, resulting in an improvement in (i.e., mitigation or even elimination of) the phenomenon of the Moiré fringes which phenomenon is caused due to a fact that the frequency of the pixel electrodes is similar to that of the touch electrodes. Meanwhile, since there are provided the second touch electrode portions whose frequency is larger than that of the first touch electrode portions, then a frequency of bright and dark stripes appearing in the display panel may be increased, such that the bright and dark stripes may not be perceived and distinguished readily by human eyes, and any visual discomfort caused by an alternate change of the bright and dark stripes may in turn by improved.

In the embodiments as illustrated in FIG. 2, it is illustrated a condition that the substrate of the touch assembly is the glass substrate of the color filter substrate. According to other embodiments, the substrate of the touch assembly 100 may for example be prepared individually and separately, and then bonded onto the glass substrate on a side of the color filter substrate facing away from the array substrate. By such an example, the effect of improvement in both the Moiré fringes and the bright and dark stripes as in aforementioned embodiments may also be achieved.

Figure 3:
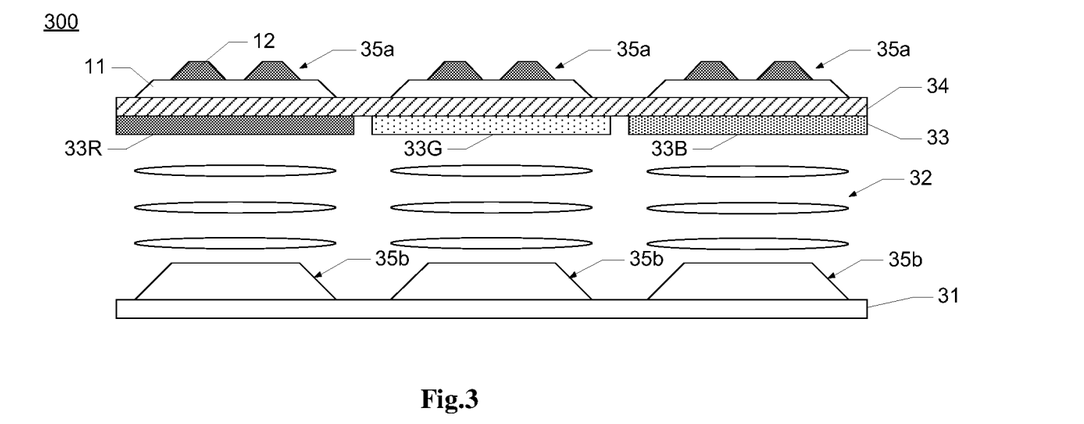
FIG. 3 illustrates a schematic sectional view of a display panel according to another embodiment of the disclosure.

FIG. 3 illustrates a schematic sectional view of a display panel 300 according to another embodiment of the disclosure, showing a touch product in which a portion of touch electrodes 35a are provided on a surface of the display panel 300. As illustrated in FIG. 3, the display panel 300 comprises a TFT array substrate 31, a liquid crystal layer 32, a color filter layer 33 and a glass substrate 34, all of which are disposed to be stacked sequentially on one another, from the bottom up. The display device 300 in this embodiment as illustrated in FIG. 3 differs from the display device 200 as illustrated in FIG. 2 in terms of that, the touch electrodes comprises a plurality of touch electrodes 35a, e.g., touch driving electrodes, which are formed on a surface of the glass substrate 34, and a plurality of other touch electrodes 36b, e.g., touch sensing electrodes, which are formed inside the display panel 300. Specifically, the touch electrodes 35b are for example formed on a surface of the array substrate 31 facing towards the glass substrate 34.

In the embodiment, an assembly, which is formed by the glass substrate 34 and the touch electrodes 35a collectively, is provided corresponding to the touch assembly 100 as illustrated in FIGS. 1A and 1B. In other words, the glass substrate 34 is provided corresponding to the substrate 10 as illustrated in FIG. 1B, and each of the touch electrodes 35a comprises a first touch electrode portion 11 and a plurality of second touch electrode portions 12 provided on the first touch electrode portion 11. A plurality of the first touch electrode portions 11 are provided alternately in a first period on the glass substrate 34 and distributed to space apart from one another, and a plurality of the second touch electrode portions 12 are provided alternately in a second period on each of the first touch electrode portions 11 and distributed to space apart from one another, the second period being smaller than the first period. As used herein, the touch electrodes 35a are for example of the structure as illustrated in FIGS. 1A and 1B, and the touch electrodes 35b are for example of a structure of conventional touch electrodes. And such an embodiment is similar in terms of other aspects thereof to the embodiment as illustrated in FIG. 2; therefore, the effect of improvement in both the Moiré fringes and the bright and dark stripes in the display panel of aforementioned embodiments of may also be achieved by this embodiment.

Figure 4:
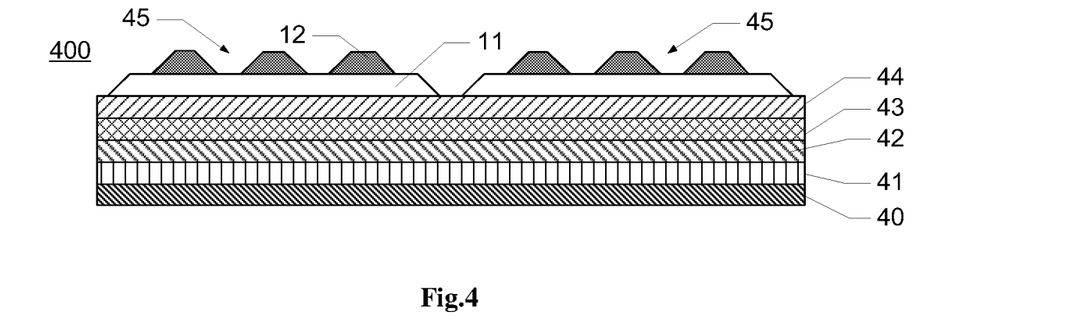
FIG. 4 illustrates a schematic sectional view of a display panel according to yet another embodiment of the disclosure.

FIG. 4 illustrates a schematic sectional view of a display panel according to yet another embodiment of the disclosure, showing that the touch assembly as illustrated in FIG. 1A is applied in an OLED panel. As illustrated in FIG. 4, the display panel 400 is an OLED panel, comprising: a substrate 40, a lower electrode 41, an organic light-emitting layer 42, an upper electrode 43 and an upper cover plate 44. A plurality of touch electrodes are formed on the upper cover plate 44. In the embodiment, an assembly formed by a glass substrate 44 and the touch electrodes 45 has the structure of the touch assembly 100 as illustrated in FIGS. 1A and 1B. In other words, the glass substrate 44 is provided corresponding to the substrate 10 as illustrated in FIG. 1B, and each of the touch electrodes 45 comprises a first touch electrode portion 11 and a plurality of second touch electrode portions 12 provided on each first touch electrode portion 11. A plurality of the first touch electrode portions 11 are provided alternately in a first period and distributed to space apart from one another, and a plurality of the second touch electrode portions 12 are provided alternately in a second period on each of the first touch electrode portions 11 and distributed to space apart from one another, the second period being smaller than the first period. As used herein, the touch electrodes 45 are for example touch driving electrodes or touch sensing electrodes. And such an embodiment is similar in terms of other aspects thereof to the embodiment as illustrated in FIG. 2; therefore, the effect of improvement in both the Moiré fringes and the bright and dark stripes in the display panel of aforementioned embodiments of may also be achieved by this embodiment.

The display panels in embodiments as illustrated in FIG. 2, FIG. 3 and FIG. 4 are only exemplary and illustrative, and it may be understood by those skilled in the art that, each of the display panels may comprise other necessary structures which are already known in the prior art, e.g., (but not limited thereto) a backlight module, a polarizer, a quarter-wave plate, pixel electrodes, a common electrode, and the like, without any further detailed description herein any more.

And a method for manufacturing the touch assembly 100 as illustrated in FIG. 1A and FIG. 1B are described hereinafter in detail.

In general, the method for manufacturing the touch assembly 100 according to an embodiment of disclosure comprises following steps of:

above all, providing the substrate 10 as illustrated in FIG. 1B, which substrate is for example an individual glass substrate, or a color filter substrate of a liquid crystal display;

next, as illustrated in FIG. 1B, forming a plurality of touch electrodes on the substrate 10, such that each of the plurality of touch electrodes comprises a first touch electrode portion 11 and a plurality of second touch electrode portions 12 provided on the first touch electrode portion 11; and the first touch electrode portions 11 are provided alternately in a first period L1 on the substrate 10 and distributed to space apart from one another, and the second touch electrode portions 12 are provided alternately in a second period L2 on each of the first touch electrode portions 11 and distributed to space apart from one another, the second period L2 being smaller than the first period L1.

Figure 5:
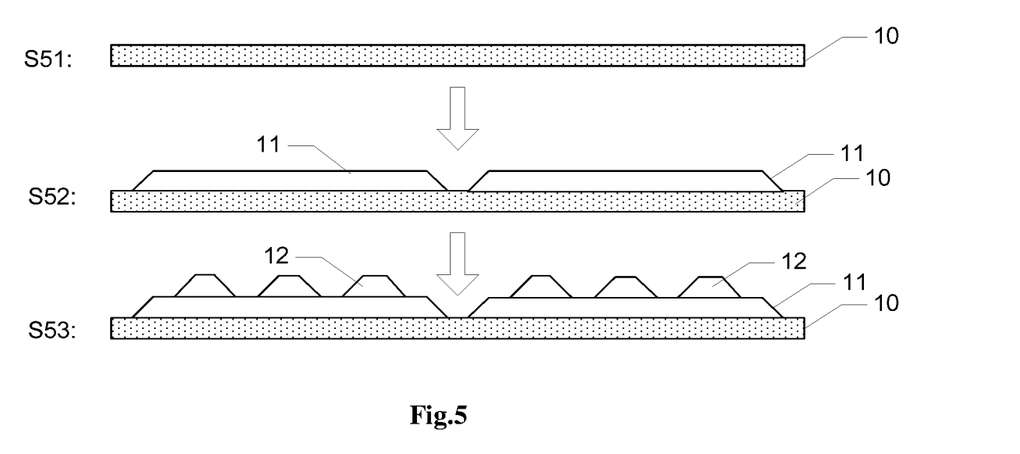
FIG. 5 illustrates a schematic view of processes of a method for manufacturing a touch assembly according to an embodiment of the disclosure.

FIG. 5 illustrates specific processes of the method for manufacturing a touch assembly according to an embodiment of the disclosure. Referring to FIG. 5, in a step S51, the substrate 10 is provided. For example, the substrate 10 may specifically refer to a glass substrate or any other substrate.

Next, in a step S52, the plurality of first touch electrode portions 11 are formed on the substrate 10, and are provided alternately in the first period and distributed to space apart from one another.

As illustrated in FIG. 5, in a step S53, the plurality of second touch electrode portions 12 are formed on each first touch electrode portion 11, and are provided alternately in the second period and distributed to space apart from one another, the second period being smaller than the first period. By way of example, the first period of the first touch electrode portions 11 is for example 2-10 times of the second period of the second touch electrode portions 12.

Specifically, forming a plurality of first touch electrode portions 11 on the substrate 10 comprises: forming a first touch electrode layer on the substrate 10; patterning the first electrode layer in a first lithography process by a first mask, so as to form the plurality of first touch electrode portions 11, and to obtain a steady and robust structure of the first touch electrode portions 11 by annealing.

And the step of forming the plurality of second touch electrode portions 12 on each first touch electrode portion 11 comprises: forming a second electrode layer on the substrate 10 on which the plurality of first touch electrode portions 11 are formed; and patterning the second electrode layer in a second lithography process by a second mask, so as to form the plurality of second touch electrode portions 12 on each of the plurality of the first touch electrode portions 11, and to obtain the touch assembly 100 by annealing.

As used herein, a material of the first electrode layer and the second electrode layer is for example a transparent ITO material. An overall thickness of the first electrode layer and the second electrode layer is substantially equal to or slightly larger than a thickness of an electrode layer of the conventional electrodes. Specifically, assuming that each first touch electrode portion 11 and the plurality of second touch electrode portions 12 provided on each first touch electrode portion 11 form collectively one of the touch electrodes in the disclosure which is provided corresponding to a single conventional touch electrode, then, an area of a cross section (or a volume) of each touch electrode in the disclosure is equal to an area of a cross section (or a volume) of each conventional touch electrode, for example; and as such, it may be ensured that an electrical resistivity of the touch electrodes remains unchanged, such that the total touch performance of the touch panel in turn remains unchanged.

The method for manufacturing the touch assembly according to the embodiment uses an ordinary mask, and is relatively simple in manufacturing processes thereof.

Figure 6:
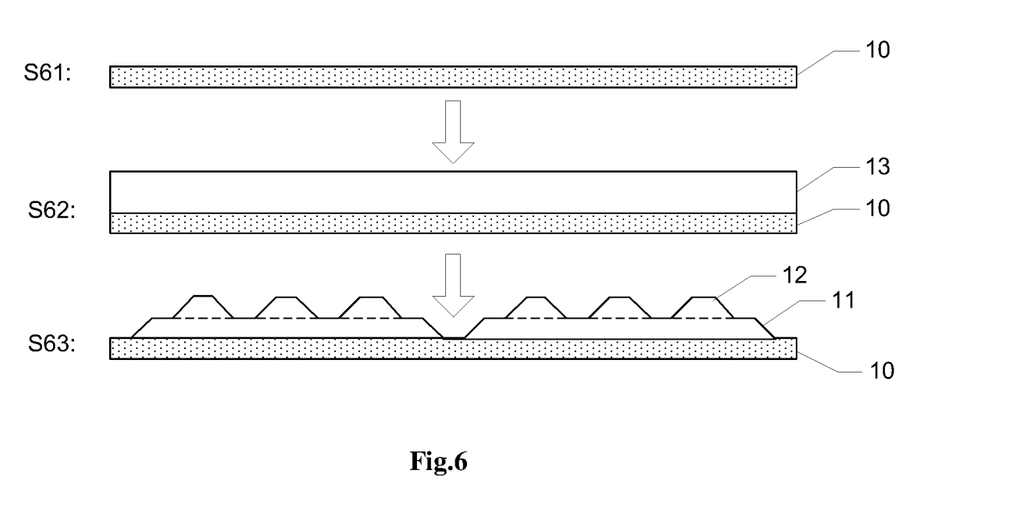
FIG. 6 illustrates a schematic view of processes of a method for manufacturing a touch assembly according to another embodiment of the disclosure.

FIG. 6 illustrates a schematic view of particular processes of a method for manufacturing a touch assembly according to another embodiment of the disclosure. Referring to FIG.

6, in a step S61, the substrate 10 is provided. For example, the substrate 10 may specifically refer to a glass substrate or any other substrate.

Then, in a step S62, on the substrate 10, an electrode layer 13 is formed with a uniform thickness thereof, which thickness is substantially equal to or slightly larger than a thickness of an electrode layer of the conventional touch electrodes.

In a step S63, the electrode layer 13 is patterned, such that the electrode 13 is formed into a plurality of first touch electrode portions 11 and a plurality of second touch electrode portions 12. As illustrated in FIG. 6, the plurality of first touch electrode portions 11 are provided alternately in the first period on the substrate 10 and distributed to space apart from one another, and the plurality of second touch electrode portions 12 are provided alternately in the second period on each first touch electrode portion 11 and distributed to space apart from one another, the second period being smaller than the first period. By way of example, the first period of the first touch electrode portions 11 is for example 2-10 times of the second period of the second touch electrode portions 12.

More specifically, the step S63 of patterning the electrode layer 13 comprises: patterning the electrode layer in a single one lithography process by a half-tone mask, so as to form the plurality of first touch electrode portions 11 and a plurality of second touch electrode portions 12.

In the method for manufacturing the touch assembly according to an embodiment of the disclosure, the half-tone mask is used, so as to decrease specific numbers of the mask(s) and to simplify manufacturing processes.

Embodiments of the method for manufacturing the touch assembly of the disclosure are set forth as above. And the method for manufacturing the touch assembly of the disclosure may not be limited to above embodiments. For example, the touch assembly as illustrated in FIGS. 1A and 1B may be formed by a mechanical machining method.

Figure 7:
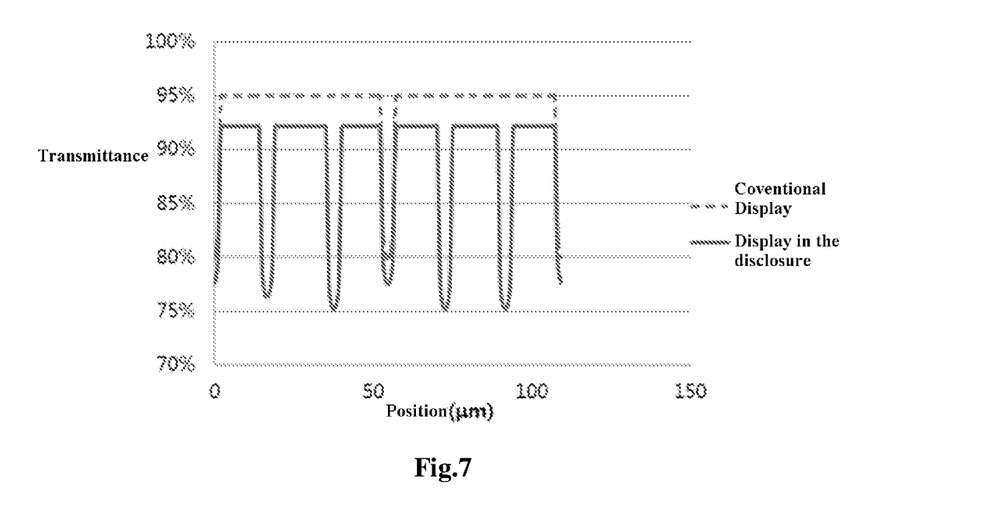
FIG. 7 illustrates a simulation diagram of bright and dark stripes caused by the display panel.

FIG. 7 illustrates a simulation diagram of bright and dark stripes caused by the display panel. As illustrated in FIG. 7, dashed lines indicate the bright and dark stripes of the display panel of a conventional structure, and solid lines indicate the bright and dark stripes of the display panel in embodiments of the disclosure. And horizontal coordinates in FIG. 7 represent positions at which the bright and dark stripes are created, and vertical coordinates in FIG. 7 represent light transmittance of the display panel. As illustrated in FIG. 7, the frequency of the bright and dark stripes of the display panel in embodiments of the disclosure is increased, and thus may not be readily perceived visually.

Figure 8:
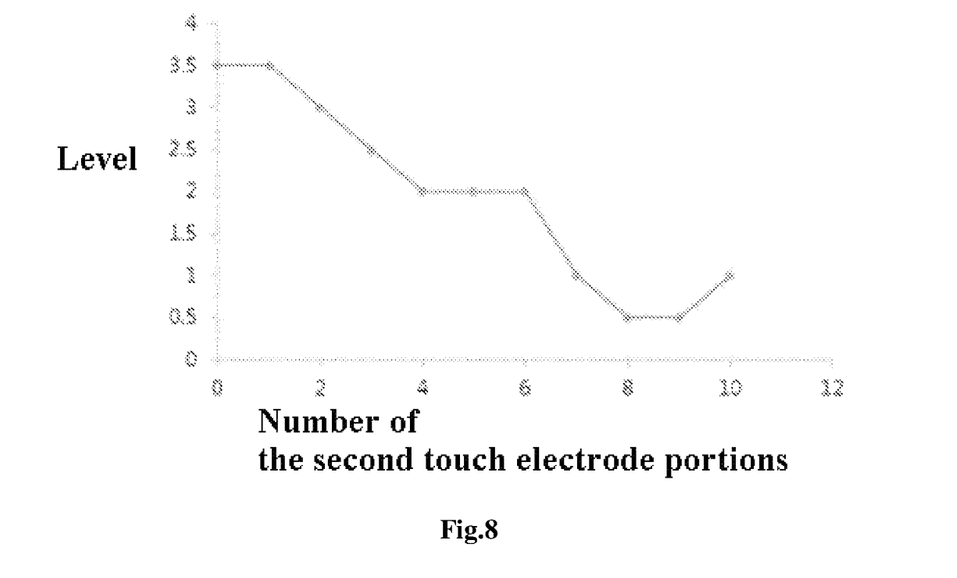
FIG. 8 illustrates a diagram of levels of Moiré fringes created by the display panel versus numbers of second touch electrode portions.

FIG. 8 illustrates a diagram of levels of Moiré fringes created by the display panel versus numbers of the second touch electrode portions. As illustrated, horizontal coordinates represent specific numbers of the second touch electrode portions on the display panel which are provided corresponding to a single sub-pixel, and vertical coordinates represent levels of Moiré fringes. It may be seen that, the specific number of the second touch electrode portions is raised from 1 to 10, with levels of Moiré fringes becoming lightened progressively. As set forth above, the touch assembly, the display panel and the method for manufacturing the touch assembly, as provided by various embodiments of the disclosure, may provide on the substrate first touch electrode portions and corresponding second touch electrode portions which are stacked sequentially on one another so as to function as an alternative to conventional touch electrodes; besides, the period of arrangement of the second touch electrode portions is made smaller than that of the first touch electrode portions, such that the second touch electrode portions may be provided with an even larger frequency, i.e., increasing the frequency of touch electrodes on a surface of the substrate, facilitating an improvement in both the Moirés fringes and the bright and dark stripes of the touch display panel.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents. As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A touch assembly, comprising:
    a substrate; and
    a plurality of touch electrodes,
    wherein each of the plurality of touch electrodes comprises a first touch electrode portion and a plurality of second touch electrode portions provided on the first touch electrode portion, and
    wherein the first touch electrode portions of all of the plurality of touch electrodes are provided alternately in a first period on the substrate and distributed spaced apart from one another, and the second touch electrode portions are provided alternately in a second period on each of the first touch electrode portions and distributed spaced apart from one another, the second period being smaller than the first period.

2. The touch assembly according to claim 1, wherein the first period of the first touch electrode portions is 2-10 times of the second period of the second touch electrode portions.

3. The touch assembly according to claim 1, wherein each of the first touch electrode portions and the second touch electrode portions has a trapezoidal cross section, inclined sides of the trapezoidal cross section of each first touch electrode portion being staggered with inclined sides of the trapezoidal cross section of each second touch electrode portion.

4. The touch assembly according to claim 3, wherein a width of a horizontal projection of each of the inclined sides of the trapezoidal cross section of each first touch electrode portion on the substrate is approximately equal to a width of a horizontal projection of each of the inclined sides of the trapezoidal cross section of each second touch electrode portion on the substrate.

5. The touch assembly according to claim 3, wherein the first touch electrode portions and the second touch electrode portions are arranged such that horizontal projections of both the inclined sides of all of the trapezoidal cross sections of the first touch electrode portions and the inclined sides of all of the trapezoidal cross sections of the second touch electrode portions on the substrate are arranged to be in a uniform distribution on a plane in parallel with the substrate.

6. The touch assembly according to claim 1, wherein a thickness of each of the first touch electrode portions and the second touch electrode portions is a multiple of a half wavelength of light passing through each of the first touch electrode portions or the second touch electrode portions.

7. The touch assembly according to claim 1, wherein each first touch electrode portion and the plurality of second touch electrode portions provided thereon are formed into an integral structure.

8. A display panel, comprising the touch assembly according to claim 1.

9. The display panel according to claim 8, wherein a period of pixel electrodes within the display panel is 1-3 times of the first period of the first touch electrode portions.

10. The display panel according to claim 9, further comprising an OLED panel, wherein the touch assembly is formed on the OLED panel.

11. The display panel according to claim 8, further comprising an OLED panel,
wherein the touch assembly is formed on the OLED panel.

12. A method for manufacturing a touch assembly, comprising:
providing a substrate; and
forming a plurality of touch electrodes on the substrate, such that each of the plurality of touch electrodes comprises a first touch electrode portion and a plurality of second touch electrode portions provided on the first touch electrode portion,
wherein the first touch electrode portions of all of the plurality of touch electrodes are provided alternately in a first period on the substrate and distributed spaced apart from one another, and the second touch electrode portions are provided alternately in a second period on each of the first touch electrode portions and distributed spaced apart from one another, the second period being smaller than the first period.

13. The method according to claim 12, wherein forming the plurality of touch electrodes on the substrate comprises:
forming on the substrate a first touch electrode layer which comprises a plurality of the first touch electrode portions; and
forming on the first touch electrode layer a second touch electrode layer which comprises the plurality of second touch electrode portions.

14. The method according to claim 13, wherein
the first touch electrode layer is patterned in a first lithography process by a first mask, so as to form the first touch electrode portions; and
the second touch electrode layer is patterned in a second lithography process by a second mask, so as to form the plurality of second touch electrode portions.

15. The method according to claim 12, wherein forming the plurality of touch electrodes on the substrate comprises:
forming an electrode layer of a uniform thickness on the substrate; and
patterning the electrode layer such that the electrode layer is formed into a plurality of the first touch electrode portions and the plurality of second touch electrode portions.

16. The method according to claim 15, wherein patterning the electrode layer comprises: patterning the electrode layer in a single one lithography process by a half-tone mask.

* * * * *